(12) United States Patent
Valadon et al.

(10) Patent No.: US 8,284,874 B2
(45) Date of Patent: Oct. 9, 2012

(54) SOFT DECISION PROCESSING

(75) Inventors: Cyril Valadon, Letchworth (GB); Carlo Pachetti, Milan (IT)

(73) Assignee: MStar Semiconductor, Inc., Grand Cayman (KY)

( * ) Notice: Subject to any disclaimer, the term of this patent is extended or adjusted under 35 U.S.C. 154(b) by 747 days.

(21) Appl. No.: 12/374,719

(22) PCT Filed: Jul. 25, 2007

(86) PCT No.: PCT/GB2007/002840
§ 371 (c)(1),
(2), (4) Date: Jan. 22, 2009

(87) PCT Pub. No.: WO2008/012541
PCT Pub. Date: Jan. 31, 2008

(65) Prior Publication Data
US 2009/0185644 A1    Jul. 23, 2009

(30) Foreign Application Priority Data
Jul. 26, 2006    (GB) .................................. 0614836.5

(51) Int. Cl.
*H04L 27/06* (2006.01)
(52) U.S. Cl. ........................................ 375/341; 375/346
(58) Field of Classification Search .................. 375/144, 375/148, 299, 262, 267, 340, 347, 349, 346
See application file for complete search history.

(56) References Cited

U.S. PATENT DOCUMENTS

| | | | |
|---|---|---|---|
| 6,243,423 B1 * | 6/2001 | Sakoda et al. ................. 375/262 |
| 6,801,565 B1 * | 10/2004 | Bottomley et al. ............ 375/148 |
| 6,980,602 B1 | 12/2005 | Kleinerman et al. |
| 2002/0037057 A1 * | 3/2002 | Kroeger et al. ................. 375/329 |
| 2002/0057735 A1 * | 5/2002 | Piirainen ........................ 375/229 |
| 2005/0025076 A1 | 2/2005 | Chaudhuri et al. |
| 2005/0138530 A1 | 6/2005 | Huang et al. |
| 2006/0062322 A1 * | 3/2006 | Namgoong et al. ........... 375/285 |
| 2006/0227909 A1 * | 10/2006 | Thomas et al. ................. 375/346 |
| 2006/0233283 A1 * | 10/2006 | Kang et al. ..................... 375/324 |
| 2007/0086513 A1 * | 4/2007 | Fernandez-Corbaton et al. ............ 375/148 |
| 2008/0063045 A1 * | 3/2008 | Cozzo et al. ................... 375/238 |
| 2009/0116545 A1 * | 5/2009 | Shearer et al. ................. 375/232 |
| 2009/0252200 A1 * | 10/2009 | Dohler et al. .................. 375/141 |
| 2010/0054371 A1 * | 3/2010 | Namgoong et al. ........... 375/340 |

FOREIGN PATENT DOCUMENTS
EP    1313249 A2    5/2003

OTHER PUBLICATIONS

Qiang, L. et al., "Generalized Soft Decision Metric Generation for MPSK/MQAM without Noise Variance Knowledge," Personal, Indoor and Mobile Radio Communications, 2003, PIMRC 2003, 14th IEEE Proceedings on Sep. 7-10, 2003, Piscataway, NJ, USA, IEEE, vol. 2, Sep. 7, 2003, XP010679148, pp. 1027-1030.

* cited by examiner

*Primary Examiner* — Emmanuel Bayard
(74) *Attorney, Agent, or Firm* — Edell, Shapiro & Finnan, LLC

(57) ABSTRACT

A method of producing soft decisions for a signal, wherein a model provides an expression for an LLR for the signal, the LLR expression is dependent on noise power in the signal and can be rendered in a form independent of the noise power, wherein the method comprises evaluating the noise power independent expression using values from the signal to produce soft decisions, calculating a weight expressing the noise power affecting a soft decision relative to the noise power affecting at least one other soft decision and applying the weight to its respective soft decision.

18 Claims, 4 Drawing Sheets

SOFT DECISION PROCESSING

BACKGROUND

In a typical radio system (see FIG. 1), information is modulated onto a radio carrier by a transmitter. This signal then travels via an unknown and changing environment to the receiver. The ability to remove the effects of the environment from the signal is often key to the performance of a receiver.

The transmitter 101 passes information bits through a block adding error protection coding 102 and then through a digital modulation block 103 which maps the sequence of coded bits $b_n$ onto complex symbols $g_n$. Error correction coding is usually applied to a block of C input samples and generates D coded samples. The mapping in 103 is performed according to the modulation scheme being used. For example, in the High Speed Downlink Packet Access (HSDPA) system standardised in the 3GPP forum, both QPSK and 16QAM modulation can be used. The number of samples M at the output of the digital modulation 103 depends on the modulation scheme being used. Finally, the RF processing unit 104 modulates the complex symbols $g_n$ onto a radio carrier.

Once transmitted, the radio signal then passes through the radio channel 105 before reception 106. This radio channel frequently gives rise to Inter-Symbol Interference (ISI) which must then be removed by the receiver to ensure correct reception. Before being processed by the receiver blocks, the signal also acquires both interference and noise. The interference arises from other users of the spectrum whilst the noise is thermal noise from the environment. Additional noise is then added as the signal passes through the Rx front end 107.

The receiver 106 converts the analogue radio signal to a digital base band signal in the Rx front-end 107. The signal is then passed through the demodulation block 108. This serves to estimate the transmitted coded-bits in the presence of the ISI, interference and noise added by the radio channel and the Rx front end. The signal is then decoded in unit 109 to yield the final received information bits.

The use of error correction coding improves the performance of the transmission link in the presence of ISI and noise and interference. The gain provided by the use of error correction coding depends on the coding scheme being used in 102 as well as on the decoding algorithm implemented in 109. The algorithms used for the error correction decoding 109 can be divided into two broad classes depending on the type of inputs being used. The first class corresponds to receivers which use hard decision decoding. These decoding techniques use only estimates of the coded bits $\{\hat{b}_k\}_{k \in (1, \ldots, D)}$ in order to produce the estimates of the uncoded bits $\{\hat{u}_k\}_{k \in (1, \ldots, D)}$. The second class corresponds to receivers which use soft decision decoding. These decoding techniques rely not only on the sequence of estimated bits $\{\hat{b}_k\}_{k \in (1, \ldots, D)}$ but also make use of information about the reliability of this bit sequence. Because the soft decision decoding approach uses information on the reliability of the estimated bits $\{\hat{b}_k\}_{k \in (1, \ldots, D)}$, soft decision decoding receivers usually perform better than hard decision decoding receivers.

When the soft decision decoding approach is used, the information input to the error correction detection unit 109 is the Log-Likelihood Ratio (LLR), which for the coded bit $b_k$ is expressed as:

$$\lambda_k = \log\left(\frac{P(b_k = 1 \mid R)}{P(b_k = 0 \mid R)}\right)$$

where R denotes the sequence of received symbols $R = \{r_k\}_{k \in \{1, \ldots, M\}}$.

As a side-note, it can be seen that estimates of the coded bits can be generated from these LLR using the following rule:

$$\hat{b}_k = \begin{cases} 0 & \text{if } \lambda_k < 0 \\ 1 & \text{otherwise} \end{cases}$$

Note that in the case where $\lambda_k = 0$, both $b_k = 0$ and $b_k = 1$ are equally likely, hence either decision is valid.

The generation of the soft decision values $\lambda_k$ generally requires the scaling of quantities by the inverse of the power of the noise in the received signal. This statement will be justified later for one embodiment of the proposed invention applied to the QPSK and 16QAM modulation schemes used in the HSDPA system. The scaling with the inverse of the noise power has an impact on the dynamic range requirements of the soft decision values. For example, in a static propagation channel the soft decisions generated when the Signal to Noise Ratio (SNR) is equal to 30 dB will be 20 dB larger than soft decisions generated in a channel with a SNR equal to 10 dB.

This change in the range of the soft decision values has an impact on the number of bits required to accurately represent these quantities. Quantisation of the soft decisions on a number of bits as small as possible keeps the memory requirements for the receiver as low as possible. The soft decisions $\lambda_k$ typically need to be buffered before they are processed as a block of D samples in the decoding unit 109. This buffering is usually required either because the structure of the error protection code is block-based or because interleaving of the data is performed in order to provide time diversity. The memory requirements for the receiver will increase linearly with the block size D and with the number of bits required to represent each soft decision value $\lambda_k$. Constraining the size of the soft decisions is particularly important when the block size D is large, as is the case for high data rate systems such as HSDPA. When the soft decision values are generated with scaling by the inverse of the noise power, the number of bits required for the quantisation of the soft decisions needs to be large enough in order to cope with channel conditions where the SNR varies between the maximum and minimum values. Hence, the scaling with the inverse of the noise power increases the number of bits required to represent the soft decisions. It should however be pointed out that for some decoding techniques, such as the Viterbi and Max-Log-MAP algorithms, the absolute level of the soft decisions doesn't modify the decoding results.

SUMMARY OF THE INVENTION

According to one aspect, the invention provides a method of producing soft decisions for a signal, wherein a model provides an expression for an LLR for the signal, the LLR expression is dependent on noise power in the signal and can be rendered in a form independent of the noise power, wherein the method comprises evaluating the noise power independent expression using values from the signal to produce soft decisions, calculating a weight expressing the noise power affecting a soft decision relative to the noise power affecting at least one other soft decision and applying the weight to its respective soft decision.

In this way, soft decisions can be produced that include the effect of noise power in such a way that the dynamic range of the soft decisions is not likely to be as great as if calculated through the noise power dependent LLR expression.

In certain embodiments, the weight assigned to a soft decision is a function of a quality metric of the soft decision and of the quality metric or metrics of at least one other soft decision. Typically, these quality metrics regard high quality as a low level of noise power; for example a quality metric of the inverse of the noise power could be used.

In one embodiment, the soft decisions are treated in groups for the purpose of weight determination, with a common weight being assigned to all the members of a group.

In one embodiment, where the soft decisions fall into predefined code blocks, the weights are used to calculate a weight for the code block per se for use when one or more soft decisions in the code block are combined with corresponding soft decisions from one or more other code blocks to produce enhanced soft decisions, e.g. in an incremental redundancy (IR) scheme.

The invention also extends to analogous apparatus.

According to one aspect, the invention provides a method of producing weights for application to soft decisions, the method comprising processing a signal, received through a physical channel, through an equaliser whose vector of filter coefficients is derived in a procedure involving the calculation of the quantity $h^H R^{-1} h$ where h is a CIR estimate of the channel and R is the correlation matrix of the signal as supplied to the equaliser and the method further comprises calculating weights for soft decisions derived from the signal as output by the equaliser using said quantity, wherein said weights express relative variation in noise power between soft decisions derived from the signal as output by the equaliser.

In this way, weights can be derived for soft decisions without explicitly calculating noise power values through re-use of a by-product of the equaliser control process.

The invention also extends to corresponding apparatus.

According to one aspect, the invention provides a method of calculating soft decisions for a signal, wherein a model provides an expression for an LLR for the signal, the expression includes a constant multiplicative factor and the method comprises acquiring parameters from the signal necessary for soft decision calculation and calculating a soft decision from the parameters using a modified form of the expression in which the factor is absent.

In this way, the calculation of soft decisions may be simplified as constant multiplicative factors often do not affect the interpretation of soft decisions when the information they convey is being recovered.

The invention also extends to corresponding apparatus.

According to one aspect, the invention provides a method of producing soft decisions for a signal, wherein the signal can use a first modulation scheme and a second modulation scheme, a first model provides a first expression for an LLR for the signal when the first modulation scheme is used, a second model provides a second expression for an LLR for the signal when the second modulation scheme is used, the second expression contains a constant scaling factor absent from the first expression and the method comprises providing a signal using the second modulation scheme and calculating soft decisions for the signal from the second expression in a form that is scaled to counter the factor.

In this way, the dynamic range of a variable required to represent a soft decision that could be of either modulation scheme may be reduced.

In certain embodiments, the first and second modulation schemes are QPSK and 16QAM and the factor is $1/\sqrt{5}$.

The invention also extends to corresponding apparatus.

According to one aspect, the invention provides a method of enhancing soft decisions, the method comprising receiving a first transmission of information using a first modulation scheme, receiving a second transmission of said information using a second modulation scheme, generating first soft decisions for the information from the first transmission, generating second soft decisions for the information from the second transmission and combining a first soft decision and a second soft decision to produce an enhanced soft decision for part of the information, wherein the second soft decision is scaled relative to the first soft decision in the combining step.

In this way, a source of artificial bias between soft decisions derived from different transmissions can be avoided.

The invention also extends to corresponding apparatus.

According to one aspect, the invention provides a method of enhancing soft decisions, the method comprising receiving a first transmission of information through a first receiver configuration, receiving a second transmission of said information through a second receiver configuration, generating first soft decisions from the first transmission, generating second soft decisions from the second transmission and combining a first soft decision and a second soft decision to produce an enhanced soft decision for part of the information, wherein the second soft decision is scaled relative to the first soft decision in the combining step to ameliorate bias caused by differences in the first and second configurations.

The invention also extends to corresponding apparatus.

According to one aspect, the invention provides a method of enhancing soft decisions, the method comprising receiving a first transmission of information, receiving a second transmission of said information, determining quality metrics for the transmissions and combining a first soft decision and a second soft decision in a manner guided by their respective quality metrics.

The invention also consists in corresponding apparatus.

Although the present invention has been described primarily in terms of method and apparatus, it is to be noted that the invention may also be implemented in software for execution through suitable data processing hardware.

BRIEF DESCRIPTION OF THE DRAWINGS

By way of example only, certain embodiments of the invention will now be described with reference to the accompanying drawings; in which:

FIG. 5 presents the 16QAM digital modulation mapping defined in the HSDPA system;

FIG. 6 presents the QPSK digital modulation mapping defined in the HSDPA system.

DETAILED DESCRIPTION

Figure 1:
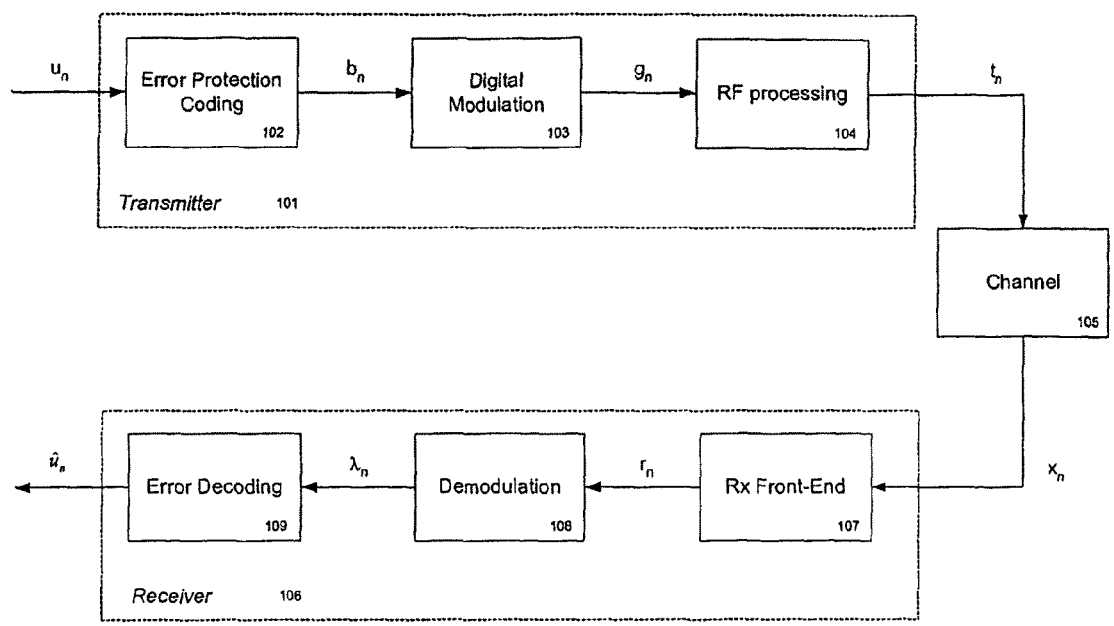
FIG. 1 presents the different processing steps in a digital cellular system.

Before commencing with a detailed description of some embodiments of the invention, attention will be drawn to some of the more prominent features of the various embodiments as an aid to the appreciation of the embodiments in depth.

This document presents a receiver architecture where the generation of soft decisions is performed using ratios between quality estimates. The generation of the D soft decision values making up a code block is performed by processing the information in K separate sub-blocks. Initial soft decisions for the bits in each of the K sub-blocks are first generated without requiring any noise power scaling. For each sub-block, a quality metric is also generated (the quality metric can, for example, be the inverse of the noise power). The information passed to the error correction decoder is then generated by scaling these initial soft decision values using ratios between quantities derived from the associated quality metrics. Hence, in the proposed soft decision scaling approach the soft decision values passed to the error correction decoder are not scaled by noise power values but by ratios between quality metrics.

In most typical transmission environments, the dynamic range associated with these quality metrics ratios will be lower than the dynamic range of the noise power values. The proposed approach therefore reduces the spread in the soft decision values. This, in turn, translates into a reduction of the size of the memory required to store the soft decision values.

It is also possible to extend this approach to efficiently cope with H-ARQ and IR. For each transmitted code block, a single quality metric is derived from the K quality metrics originally calculated for the different sub-blocks. This single quality metric can for example be calculated as the average of the sub-block quality metric values. Alternatively, it would be possible to use the maximum value across the K different sub-blocks. This single quality metric value is associated with a set of soft decisions spanning a full code block. When IR is used and soft decisions from multiple transmissions need to be combined before being passed to the channel decoder, the quality metrics associated with the different versions of the received code block are used to weight the different soft decisions. Using the proposed approach helps reduce the growth in the number of bits required to store the combined soft decisions when multiple transmissions of the same information are required.

The proposed approach also makes it possible to reduce the implementation complexity of the constellation demapping process when IR is used with multiple different modulation schemes. The quality metric values used to perform the weighted combinations of soft decisions across multiple transmissions can be modified to reflect any difference in scaling of the soft decisions by the constellation demapping process.

The proposed approach can also be extended to efficiently operate when the selected implementation of the signal-conditioning unit is adapted to the propagation channel conditions. It is possible to apply different correction factors to the quality metrics depending on the implementation of the signal-conditioning unit. Doing so guarantees that soft decisions generated by different signal-conditioning units are combined with the correct weighting before being passed to the channel decoder.

In two embodiments of the proposed architecture, it is shown that the quality metrics can be derived directly from the computations performed in the signal-conditioning process.

Figure 2:
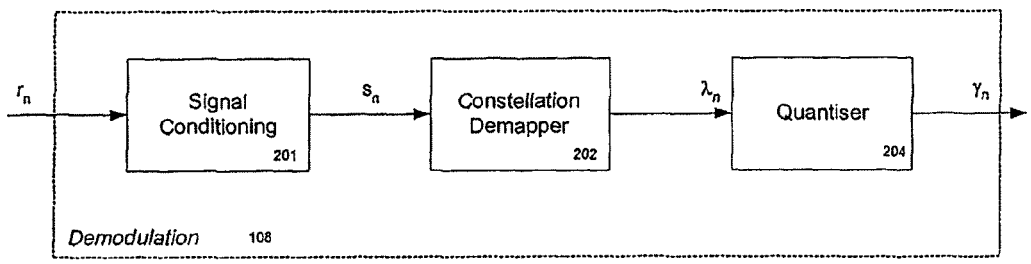
FIG. 2 presents a typical implementation of a digital demodulation unit.

FIG. 2 presents a typical implementation of the demodulation unit 108. The received signal $r_n$ is first passed to the signal conditioning unit 201 to generate the signal $s_n$. The signal processing performed in the signal-conditioning unit 201 depends on the transmission format as well as on the propagation environment. For example, in CDMA systems it is typical to use a Rake receiver in order to combine the contributions coming from the different propagation paths (*CDMA—Principles of Spread Spectrum Communication*, Andrew J. Viterbi, *Addison-Wesley Wireless Communications Series*). It should however be noted that the performance of the Rake receiver is degraded by the presence of ISI.

More recently, new receiver architectures have been introduced where the demodulation accuracy is improved at the expense of the implementation complexity. The Linear Minimum Mean Square Error (LMMSE) equaliser is an example of such an architecture (*Chip-Level Channel Equalization in WCDMA Downlink*, K. Hooli, M. Juntti, M. J. Heikkila, P. Komulainen, M. Latva-aho, J. Lilleberg, *EURASIP Journal on Applied Signal Processing*, August 2002). The LMMSE equaliser improves the performance of the demodulation unit by mitigating the distortions introduced by the propagation channel. The LMMSE, equaliser can be implemented using a pre-filter Rake architecture (*Equalization in WCDMA terminals*, Kari Hooli, PhD thesis, 2003) where the conventional Rake receiver is preceded by a linear filter which aims at removing the ISI introduced by the channel. The aim of the signal conditioning unit 201 is to remove the impairments introduced in the transmission channel (including the RF processing at both Tx and Rx ends) so as to generate estimates of the transmitted sequence of modulated symbols $g_n$.

The signal generated by the signal-conditioning unit 201 can be expressed as follows:

$$s_n = \alpha \times g_n + \upsilon$$

$\alpha$ is a real scaling factor representing the different gain stages in the receiver chain. The value of this factor may either be known $\alpha$-priori or can be estimated from the received signal. $\upsilon$ represents the noise in the signal after the signal-conditioning unit 201. It is typically modelled as white Gaussian noise with variance equal to $\sigma_v^2$. For a given propagation environment, the power of the noise $\sigma_v^2$ depends on the implementation of the signal-conditioning unit 201. For example, the noise power will typically be lower for the LMMSE than for the Rake receiver.

The signal demapper 202 generates LLR from the signal $s_n$ using the following equation:

$$\lambda_k = \log\left(\frac{\sum_{g_m|b_k=1} P(s_n \mid g_m)}{\sum_{g_m|b_k=0} P(s_n \mid g_m)}\right)$$

$s_n$ is the received complex symbol associated with the transmitted bit $b_k$ for which the LLR is being calculated. The transmitted and received modulation symbols can be expressed through their real and imaginary components.

$$\begin{cases} s_n = a + jb \\ g_m = I + jQ \end{cases}$$

the indices n and m have been dropped in the real/imaginary expressions to simplify further equations.

Using these notations and omitting constants terms (including multiplicative terms) which disappear when the LLR is calculated, the conditional probabilities $P(s_n|g_m)$ can be expressed as follows:

$$P(s_n | g_m) = \exp\left(\frac{1}{\sigma_v^2}\left(I\left(a\alpha - \frac{\alpha^2 I}{2}\right)\right)\right) \times \exp\left(\frac{1}{\sigma_v^2}\left(Q\left(b\alpha - \frac{\alpha^2 Q}{2}\right)\right)\right)$$

This equation can be used to generate the LLR from the signal generated by the signal-conditioning unit 201. The application of this approach to the QPSK and 16QAM modulation schemes defined in the HSDPA system will now be described in more detail.

FIG. 6 presents the QPSK modulation mapping defined in the HSDPA system. If the different sets of two bits used to define a constellation symbol are denoted as $\{b_k, b_{k+1}\}$ where k is an even number, it can be shown that:

$$\begin{cases} \lambda_k = -\frac{2 \times a \times \alpha}{\sigma_v^2} & \text{when } k \text{ is even} \\ \lambda_k = -\frac{2 \times b \times \alpha}{\sigma_v^2} & \text{when } k \text{ is odd} \end{cases}$$

The above equation shows, as indicated previously, that the generation of the soft decisions requires the scaling of the real and imaginary components of the received signal by the inverse of the noise power $\sigma_v^2$.

The same analysis can be performed for the 16QAM modulation with mapping presented in FIG. 5. Each set of 4 bits used to define a constellation symbol is denoted as $\{b_k, b_{k+1}, b_{k+2}, b_{k+3}\}$ where k mod 4=0. The LLR for the first set of bits (k mod 4=0) can then be expressed as:

$$\lambda_k = -\frac{5 \times a \times \alpha}{\sigma_v^2 \sqrt{5}} - \log\left(\frac{\cosh\left(\frac{a \times \alpha}{\sigma_v^2 \sqrt{5}} - \frac{2 \times \alpha^2}{5 \times \sigma_v^2}\right)}{\cosh\left(\frac{a \times \alpha}{\sigma_v^2 \sqrt{5}} + \frac{2 \times \alpha^2}{5 \times \sigma_v^2}\right)}\right)$$

The above expression can then be simplified through the use of a piece-wise linear approximation.

$$\begin{cases} \lambda_k = -\frac{4 \times \alpha}{\sigma_v^2 \sqrt{5}} \times \left(a - \frac{\alpha}{\sqrt{5}}\right) & \text{if } a > \frac{2 \times \alpha}{\sqrt{5}} \\ \lambda_k = -\frac{4 \times \alpha}{\sigma_v^2 \sqrt{5}} \times \left(a + \frac{\alpha}{\sqrt{5}}\right) & \text{if } a < -\frac{2 \times \alpha}{\sqrt{5}} \\ \lambda_k = -\frac{2 \times a \times \alpha}{\sigma_v^2 \sqrt{5}} & \text{otherwise} \end{cases}$$

It can be seen that, as was observed for the QPSK modulation, the component of the received signal a is multiplied by the inverse of the noise power. An identical expression can be obtained for the second set of bits (k mod 4=1) where the real part of the received signal a is replaced by the imaginary part of the received signal b.

The soft decision values for the third set of bits (k mod 4=2) can be calculated as follows:

$$\lambda_k = -\left(\frac{4 \times \alpha^2}{5 \times \sigma_v^2}\right) - \log\left(\frac{\cosh\left(\frac{a \times \alpha}{\sigma_v^2 \sqrt{5}}\right)}{\cosh\left(\frac{3 \times a \times \alpha}{\sigma_v^2 \sqrt{5}}\right)}\right)$$

This can then be closely approximated by the following expression:

$$\lambda_k = -\frac{2 \times \alpha}{\sigma_v^2 \sqrt{5}} \times \left(\frac{2 \times \alpha}{\sqrt{5}} - |a|\right)$$

A similar expression can be derived for the last set of bits (k mod 4=3) where the real component of the received signal a is replaced by the imaginary component b of the received signal.

The soft decision values $\lambda_n$ are then quantised in unit 204 to generate quantised soft decision values $\gamma_n$. The aim of the quantisation process is to minimise the number of bits required to represent the soft decision values without significantly degrading the decoding performance of the decoder. As indicated before the number of bits required to store the soft decision values $\gamma_n$ directly impacts on the memory requirements of the receiver.

Figure 3:
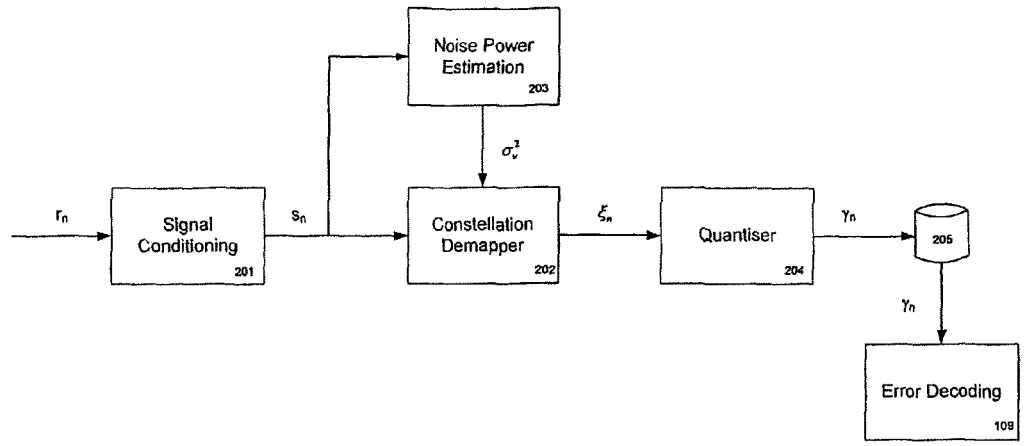
FIG. 3 presents a prior-art implementation of the soft decision scaling.

For both QPSK and 16QAM modulation schemes and for the different types of bits in each modulation scheme, the LLR values are derived by dividing an expression of the received signal by the power of the noise. As a result of this, the generation of the soft decisions is typically performed as described in FIG. 3. The received signal $r_n$ is first passed to the signal conditioning unit 201 to generate the signal $s_n$. The power of the noise in the received signal $\sigma_v^2$ is then estimated in unit 203 from the signal $s_n$. The constellation demapper 202 combines the estimated noise power values $\sigma_v^2$ with the received signal $s_n$ in order to generate the LLR values $\lambda_k$. The computations to generate the soft decision values are performed according to the previous equations and depend on the modulation scheme being used. The soft decisions $\lambda_k$ are then quantised in unit 204 and then buffered (205) until values for a complete code block have been generated. At that point, error correction decoding can be performed in 109.

It should be noted that the rate at which noise power estimates need to be generated depends on the transmission environment as well as on the implementation of the signal-conditioning unit 201. In fast changing environments, it is usually necessary to use a smaller update period. It is typical to use an update rate which is similar to the rate at which the signal-conditioning unit configuration is modified.

In the prior-art implementation of the soft decision scaling (FIG. 3), the soft decisions are generated with a scaling equal to the inverse of the noise power. The number of bits required for the quantised soft decisions $\gamma_n$ increases when the range of values taken by the noise power $\sigma_v^2$ becomes larger. If the receiver is to operate in an environment where the SNR can take significantly different values, the number of bits for the quantised soft decisions can become very large. This will drive up the memory requirements for the buffer 205.

Figure 4:
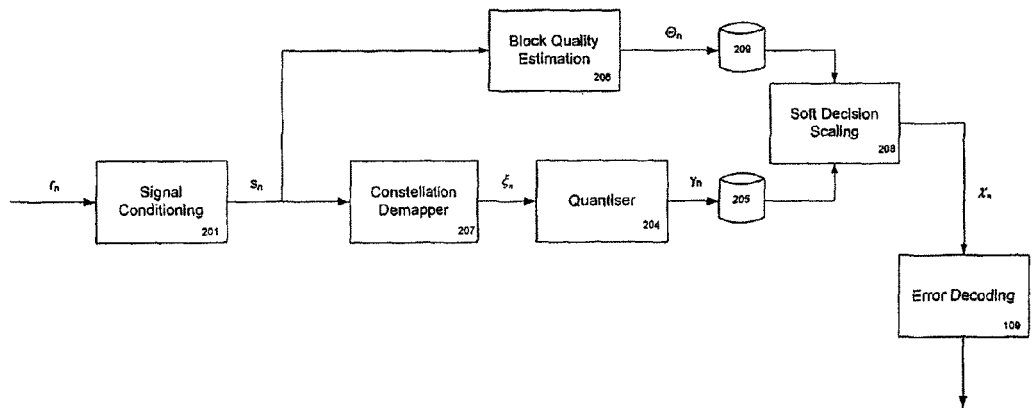
FIG. 4 presents the implementation of the soft decision scaling according to one embodiment of the proposed invention.

However, as indicated before, for most decoding receivers 109 it is possible to scale the soft decisions by a fixed factor without modifying the generated data stream. It is important to keep the ratio between the different soft decisions consistent with the noise power values within one code block but the absolute level of the different soft decisions does not affect the decoding result. This property of the soft decisions can be used in order to reduce the number of bits required to represent the quantised soft decisions. FIG. 4 presents one embodiment of the proposed demodulation unit 108 making use of this characteristic.

As before, the received signal $r_n$ is passed to the signal-conditioning unit 201 in order to generate the signal $s_n$. This signal is then passed to the constellation demapper 207 in order to generate a first set of initial soft decision values $\xi_n$. It should be stressed that the implementation of the proposed constellation demapper 207 is noticeably different to that of the prior-art solution 202. In the prior art solution, the constellation demapper requires noise power values $\sigma_v^2$ in order to generate the soft decisions (see previous equations describing how the LLRs are generated). In the proposed implementation of the constellation demapper 207, the scaling with the noise power values is ignored. The following equations exemplify the difference between the two approaches for the first sets of bits in case of a QPSK modulation:

$$\lambda_k = -\frac{2 \times a \times \alpha}{\sigma_v^2} \text{ in the prior art solution 202}$$

$\xi_k = -2 \times a \times \alpha$ in the proposed implementation of the constellation demapper 207.

The proposed implementation of the constellation demapper 207 doesn't require any knowledge of the noise power $\sigma_v^2$ in order to generate the soft decision values $\xi_n$. These initial soft decision values $\xi_n$ are then passed to the quantisation unit 204 and the resulting quantities $\gamma_n$ are stored in a buffer 205.

The signal $s_n$ generated by the signal conditioning unit 201 is also used to derive quality estimates of the received signal $\Theta_n$ in unit 206. It is assumed, without any loss of generality, that the D soft decision values making up one code block can be divided into K sub-blocks of L values. A single quality estimate value $\Theta_n$ is generated for each sub-block and the K values associated with a code block are stored in a buffer 209.

Different implementations of the block quality estimation unit 206 are possible. In one embodiment of the proposed invention, the block quality metric associated with a sub-block k can be derived as the inverse of the power of the noise $\sigma_v^2$ in the received signal. In such an embodiment, different techniques can be used to derive the noise power estimate $\sigma_v^2$. The noise power can, for example, be derived from the power of the received signal. Alternatively, if a training or pilot sequence is transmitted alongside of the information to be recovered, the receiver can make use of these symbols known a-priori in order to estimate the noise power.

In another embodiment of the proposed invention to be described in more detail further on, the quality metrics can be directly derived from knowledge of the processing performed in the signal-conditioning unit 201.

The soft decisions $\gamma_n$ stored in buffer 205 and the associated quality metrics $\Theta_n$ stored in buffer 209 are then combined in the soft decision scaling unit 208 in order to generate the soft decision values $\chi_n$ used by the error correction decoding process 109. The soft decision scaling unit 208 operates once the initial soft decisions and the quality metrics have been generated for a complete code block. The generation of the LLR values $\chi_n$ is performed by scaling the initial soft decision values $\gamma_n$ by quantities derived from ratios between quality metrics $\Theta_n$.

Different techniques can be used to generate the LLR values $\chi_n$ and two possible implementation will now be described. $\gamma_l^k$ denotes the lth soft decision within the kth sub-block (hence l varies between 0 and L−1 and k can take values between 0 and K−1). The quality metric associated with the soft decisions forming part of the kth sub-block is denoted as $\Theta_k$. The LLR value corresponding to the lth soft decision within the kth sub-block is denoted as $\chi_l^k$. The soft decision scaling unit 208 generates the final soft decision values using the following scaling:

$$\chi_l^k = \gamma_l^k \times f_k(\Theta_0, \Theta_1, \ldots, \Theta_{K-1})$$

where $f_k$ is a function, specific to sub-block k, of the quality metrics accumulated over the whole code block.

In one embodiment of the proposed invention the scaling function is implemented as described in the following equation:

$$f_k(\Theta_0, \Theta_1, \ldots, \Theta_{K-1}) = K \times \frac{\Theta_k}{\sum_{m=0}^{K-1} \Theta_m}$$

Alternatively, it would be possible to generate a scaling function as follows:

$$f_k(\Theta_0, \Theta_1, \ldots, \Theta_{K-1}) = \frac{\Theta_k}{\max_{m \in \{0, \ldots, K-1\}}(\Theta_m)}$$

It will be easy for someone skilled in the art to generate different scaling functions. Typically the scaling function will aim to give a larger weight to soft decisions associated with a sub-block where the quality metric $\Theta_n$ is large compared to the set of values within one code block.

The soft decision values generated before and after soft decisions scaling 208 are quantised in order to keep the number of bits required to represent them as low as possible. Typically a fixed-point notation will be employed to store these values. It should however be noted that the values generated by the scaling functions $f_k$ may not be integer or rational values. Hence, rounding, saturation and/or truncation is required following the multiplication of the initial soft decision values $\gamma_l^k$ by the scaling function $f_k$.

It is interesting to note that for the two described implementations of the functions $f_k$, the scaling is always equal to 1 when the values of the quality metrics $\Theta_n$ do not change across a single code block. In this case the soft decision values $\chi_l^k$ passed to the error correction decoding unit 109 are simply equal to the initial soft decision values $\gamma_l^k$. Moreover, these initial soft decision values $\gamma_l^k$ are generated directly from the received signal without requiring any scaling by noise power values. Hence when the quality metrics $\Theta_n$ do not vary across a single code block, the dynamic range required for the soft decision $\chi_l^k$ is independent of the spread of SNR values for the transmission environment. Hence, the proposed scheme significantly reduces the number of bits required to store the soft decision values $\chi_l^k$ for channels whose characteristics vary slowly.

It should also be noted that the number of bits required to represent the initial soft decision quantities $\gamma_i^k$ is not required to be identical to the number of bits used for the LLR values $\chi_i^k$. It may, for example, be possible to use fewer bits to store the LLR values $\chi_i^k$ than to represent the initial soft decision value $\gamma_i^k$. The reduction in the number of bits needed to store the soft decisions may be achieved by characterising the distribution of the soft decisions before and after soft decision scaling 208.

As indicated before, the implementation of the constellation demapper 207 does not require any scaling by the inverse of the noise power value $\sigma_v^2$. This simplifies the implementation of the constellation demapper 207. The number of computations to be performed can be further reduced by ignoring the multiplicative terms that are common to the different equations.

The constellation demapper for the QPSK modulation can therefore be implemented by using the following equations (the constant multiplicative term $2\times\alpha$ has been ignored).

$$\begin{cases} \xi_k = -a & \text{when } k \text{ is even} \\ \xi_k = -b & \text{when } k \text{ is odd} \end{cases}$$

Similarly, the initial soft decisions for the first two sets of bits for the 16QAM modulation can be derived as follows (for the second set of bits b should replace a):

$$\begin{cases} \xi_k = -\frac{1}{\sqrt{5}} \times (2a - \beta) & \text{if } a > \beta \\ \xi_k = -\frac{1}{\sqrt{5}} \times (2a + \beta) & \text{if } a < -\beta \\ \xi_k = -\frac{1}{\sqrt{5}} \times a & \text{otherwise} \end{cases}$$

where $\beta = \frac{2\times\alpha}{\sqrt{5}}$.

The initial soft decisions for the last two sets of bits for the 16QAM modulation can be derived as follows (for the fourth set of bits b should replace a):

$$\xi_k = -\frac{1}{\sqrt{5}} \times (\beta - |a|)$$

It is easy to see that these equations are significantly easier to implement than the equations corresponding to the prior-art implementation 202.

Some observations on the range of the values generated for the QPSK and 16QAM modulations can also be made from these equations. It can be seen that for the QPSK modulation, the level of the even soft decisions is equal to $a/\sqrt{5}$. For the 16QAM modulation, the level of even soft decisions is typically equal to $a/\sqrt{5}$. A similar observation can be made for the odd soft decisions by replacing the real component of the received signal a with the imaginary component of the received signal b. From this simple observation, one can conclude that the soft decisions obtained for the QPSK modulation will typically be larger than the 16QAM soft decisions by a factor of $\sqrt{5}$. This is not surprising and can be explained by the larger distances between modulation symbols in case of QPSK compared to 16QAM. However, this means that the range of values taken by the soft decisions will depend on the modulation scheme being used. When different modulation schemes can be used, the overall dynamic range of the soft decisions need to be large enough to be able to cope with the different modulation schemes. As a result of this, the use of different modulation schemes could lead to an increase in the number of bits required to store the soft decisions.

However, as indicated before, constant multiplicative factors do not modify the decisions taken by the error correction decoding unit 109. Hence, it is possible to multiply the soft decisions generated for the 16QAM modulation by a factor of $\sqrt{5}$ without changing the decisions taken during the decoding of a single code block. When this is performed, the implementation of the constellation demapper can be described by the following equations:

$$\begin{cases} \xi_k = -(2a - \beta) & \text{if } a > \beta \\ \xi_k = -(2a + \beta) & \text{if } a < -\beta \text{ for even bits} \\ \xi_k = -a & \text{otherwise} \end{cases} \begin{pmatrix} b \text{ replaces } a \text{ for the} \\ \text{set of } 3^{rd} \text{ bits} \end{pmatrix}$$

and $\xi_k = -(\beta - |a|)$ for odd bits (b replaces a for the set of $4^{th}$ bits)

This modified implementation of the constellation demapper 207 presents a number of advantages over the prior-art solution 202. First, the soft decision values $\xi_k$ can now be generated without requiring any multiplication operation (the factor of 2 can be implemented as a shift when fixed-point representation is used). Hence, the implementation complexity of the proposed constellation demapper 207 is significantly lower than that of the prior-art solution 202. Moreover, the level of the 16QAM soft decisions now varies with a, as is the case for the QPSK soft decisions. Hence, the dynamic range of the soft decisions is now largely independent of the modulation scheme being used. This, in turn, helps reduce the number of bits required to store of the soft decisions and leads to a lower memory requirement for the receiver.

It should however be noted that this approach does not work when H-ARQ and Incremental Redundancy (IR) across multiple modulation schemes are used. H-ARQ and IR improve the quality of the transmission link by transmitting multiple versions of the user information until successful decoding can be achieved. At the receiver, the soft decisions need to be buffered and combined across multiple transmissions until their quality is high enough for the error correction decoder to be able to recover the useful information. The combination of the soft decisions in the IR buffer is typically performed by summing soft decisions corresponding to the same information bit and received over multiple transmissions.

It is possible for the different transmissions to use different modulation schemes. For example, the IR scheme used in the HSDPA system allows the different transmissions corresponding to the same information to select either the QPSK or the 16QAM modulation scheme. Hence, at the receiver it will be potentially required to combine soft decisions generated from different modulation schemes. When the constellation demapper 207 is modified to be able to generate soft decisions without any multiplication, the 16QAM soft decisions are larger than they should be by a factor equal to $\sqrt{5}$. This doesn't have any impact on the decoding when all the transmissions for a given set of information bits use the same modulation scheme. However, if 16QAM and QPSK modulation soft decisions need to be combined, the proposed implementation of the constellation demapper 207 will not be optimum in terms of link-level performance. This is due to the fact that the 16QAM soft decisions are larger than they should be and have a disproportionate weight in the generation of the combined soft decisions.

Figure 7:
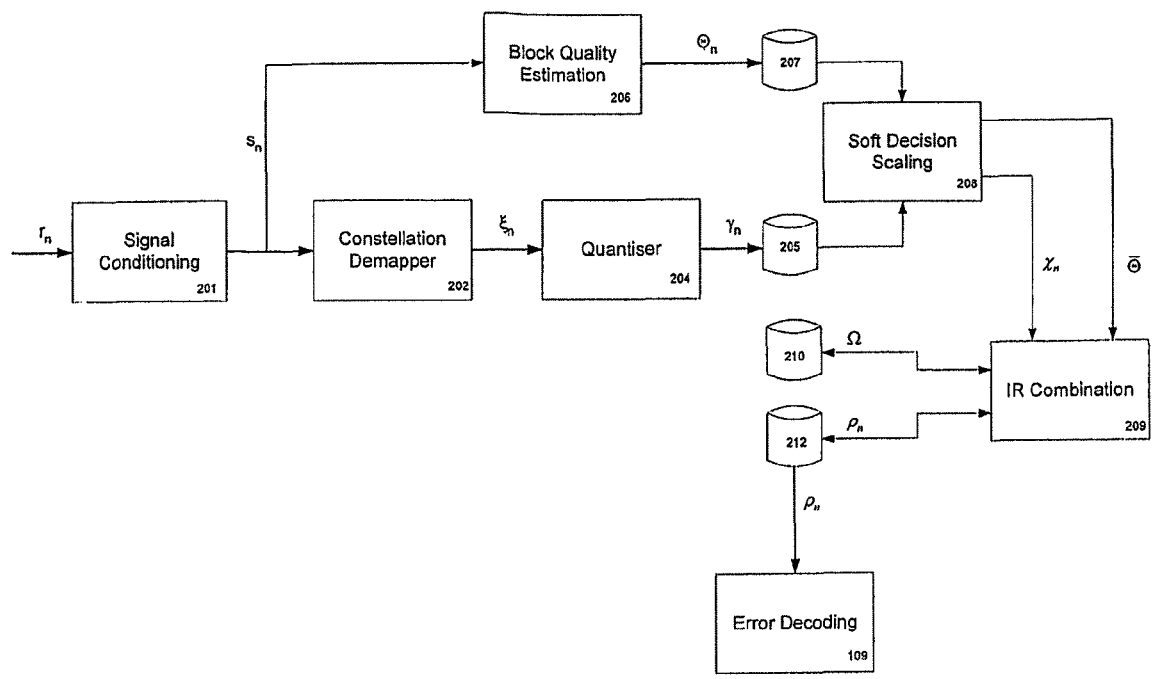
FIG. 7 presents the implementation of the soft decision scaling according to one embodiment of the proposed invention when incremental redundancy is used.

FIG. 7 presents an implementation of the soft decision scaling receiver where it is possible to use the simplified constellation demapper 207 even when IR with multiple modulation schemes is used. Support of different modulation schemes is provided by modifying the soft decision scaling function 208 such that a single quality metric value $\overline{\Theta}$ associated with the K different sub-blocks is output alongside the soft decision values $\chi_n$.

In one embodiment, the value of $\overline{\Theta}$ is equal to the denominator used in the functions $f_k$. However, the proposed approach is not limited to this specific case. Any function of the quality metrics $\Theta_k$ associated with the K different sub-blocks forming a code-block could be used.

The quality metric value $\overline{\Theta}$ is used to provide different weights to the soft decisions received from different transmissions and combined in 209 according to the modulation scheme being used. The IR combination unit 209 combines the soft decisions received from the different versions of the transmitted information. The combined soft decisions are stored in a buffer 212 before being used by the error correction decoding unit 109. The IR combination unit 209 also generates a quality metric $\Omega$ associated with the soft decision values stored in buffer 212. This quality metric $\Omega$ itself is stored in buffer 210. Both the quality metric $\Omega$ and the soft decisions $\rho_n$ are updated when soft decisions corresponding to a new transmission are received.

One possible implementation of the IR combination unit 209 will now be described. It is assumed that m different transmissions of the information to be recovered have already been performed. The quality metric $\Omega$ stored in 210 is denoted as $\Omega(m)$ in order to make the dependency on the number of transmissions clear. Similarly, the soft decision values stored in 212 are denoted as $\rho_n(m)$. Upon reception of a new set of soft decision values $\chi_n$ and the associated quality metric $\overline{\Theta}$, the contents of the buffers 210 and 212 are updated. In one embodiment of the described receiver, the update is performed according to the following equations:

$$\begin{cases} \Omega(m+1) = \max(\Omega(m), \overline{\Theta}) \\ \rho_n(m+1) = \frac{1}{\Omega(m+1)} \times ((\Omega(m) \times \rho_n(m)) + (\overline{\Theta} \times \chi_n)) \end{cases}$$

It should be noted that this only one possible implementation of the IR combination unit. It will be obvious that the proposed approach can easily be extended to different combination operations. It would be possible to update the quality metric values $\Omega(m+1)$ through a weighted sum of the previous value $\Omega(m)$ and the new quality metric $\overline{\Theta}$.

In prior-art implementations of the IR combination process, the soft decision values are typically added across multiple transmissions. As a result of this, the amplitude of the combined soft decisions tends to increase with the number of transmission. Hence, the number of bits required to store the combined soft decisions increases with the number of transmissions (or the number of bits needs to be large enough to cope with the largest possible number of transmissions). It can be seen from the equation describing the computations performed in the proposed IR combination unit that the increase in the amplitude of the soft decisions is limited. This is due to the fact that the soft decisions are scaled by the inverse of the maximum quality metric value.

As indicated before, the different quantities used in the IR combination process are usually stored using a fixed-point representation. Hence, rounding, saturation and/or truncating is therefore performed on the values generated by the IR combination process 209.

It should now be stressed that the approach described in FIG. 7 allows the IR combination process to efficiently operate even when transmissions use different modulation schemes. It was indicated before that the constellation demapper 207 operating without multiplicative operations does not provide soft decisions with correct weights across different modulation schemes. For example, the soft decisions generated from the 16QAM modulation are over-scaled by a factor equal to $\sqrt{5}$. In the proposed approach, this can easily be compensated for in the generation of the quality metric $\overline{\Theta}$.

The quality metrics $\overline{\Theta}$ can be scaled so as to correct for any weighting that has been omitted during the constellation demapping process. In the case of IR using both QPSK and 16QAM modulation, it is possible to divide the quality metric generated for 16QAM by $\sqrt{5}$. As a result of this, a lower weight will be given to 16QAM soft decisions compared to QPSK soft decisions in the IR combination process. The same result could be achieved by multiplying the quality metric $\overline{\Theta}$ associated with the QPSK modulation by $\sqrt{5}$.

Hence, the proposed approach makes it possible to use a very simple implementation of the constellation demapper 207 even when multiple modulation schemes are used in conjunction with IR. This is achieved by correcting for any incorrect scaling between the soft decisions for the different modulations through the quality metric $\overline{\Theta}$.

It was indicated before that the quality metrics $\Theta_n$ can be derived from the received signal $s_n$ through estimation of the noise power. In one specific embodiment of the proposed receiver architecture, the quality metrics $\Theta_n$ can be directly estimated from the computations performed in the signal-conditioning unit 201. When Minimum Variance Distortionless Response (MVDR) equalisation is performed in unit 201, the quality metrics $\Theta_n$ can be derived directly from the coefficients of the equalisation filter.

In the MVDR equaliser, samples of the received signal $r_n$ are passed through a linear FIR filter with coefficients denoted w. The coefficients w of the filter are derived so as to minimise the following error signal:

$$w = \arg\min(E(|w^H r|^2)) \text{ with } w^H h = 1$$

where h denotes the propagation channel.

It has been shown that the filter coefficients can be derived using the following equation (*Efficient Linear Equalisation for High Data Rate Downlink CDMA Signaling*, J Zhang, T. Bhatt and G. Mandyam).

$$w = \frac{R^{-1} h}{h^H R^{-1} h}$$

where R denotes the correlation matrix of the received signal.

When such a signal-conditioning unit is used, it is possible to derive the quality metrics $\Theta_n$ directly from the scalar value $\Psi = h^H R^{-1} h$ which is calculated during the derivation of the filter coefficients.

In one preferred embodiment, the quality metrics are derived using the following equation:

$$\Theta_n = \frac{\Psi}{1-\Psi}$$

In an alternative embodiment, the quality metrics are derived as follows:

$$\Theta_n = \Psi^2$$

It is interesting to note that for both embodiments the quality metric values $\Theta_n$ are derived without the need for explicit estimation of the noise power from the received signal $s_n$.

It was indicated previously that the power of the noise in the samples $s_n$ depends not only on the propagation environment but also on the selected implementation of the signal-conditioning unit. It is typically possible to reduce the noise power by using more complicated signal processing operations. For example, the pre-filter Rake eliminates most of the ISI and will therefore provide an output signal with significantly less noise than the more conventional Rake receiver. In a number of communication systems, multiple logical channels are transmitted and need to be processed by the receiver. For example, channels containing control information may be multiplexed with channels carrying user information. In the HSDPA system, the HS-SCCH channel carries information on the format of the HS-DSCH channel. In order to retrieve the user data information sent using the HS-DSCH channel, the receiver needs first to demodulate and decode the HS-SCCH channel. Hence, the receiver needs to process different logical channels with potentially different transmission formats. The different logical channels could, for example, use different modulation schemes. Since the different channels have different characteristics, it is possible to use different implementations of the signal-conditioning unit for the different channels. For example, in the HSDPA system, it would be possible to receive the HS-SCCH channel using a Rake receiver whereas the HS-DSCH could be processed by a pre-filter Rake. In such a case, the proposed approach still allows for the simplified implementation of the constellation demapper 207 to be used for the different logical channels. Any difference in the noise power for the different signal-conditioning approaches can then be accounted for with the quality metrics $\Theta_n$.

The optimum implementation of the signal-conditioning unit depends on the propagation environment. In single path channels, the pre-filter Rake doesn't provide any performance advantage over the simpler Rake receiver. On the other hand, in channels with multiple propagation paths, the pre-filter Rake will perform significantly better than the Rake receiver. Hence, it would be possible for the signal-conditioning unit to switch between these two implementations as the propagation conditions vary. The noise level associated with these different implementations will be different. When IR is used, it may be necessary to combined soft decisions generated by the pre-filter Rake with soft decisions from the more conventional Rake receiver. In such a case, it is important to make sure that the relative weights between these different soft decisions is correct (typically the soft decisions from the Rake receiver should have a lower weight than those generated by the pre-filter Rake receiver). The proposed approach allows this to be performed efficiently by applying a correction factor to the quality metrics $\Theta_n$. The value of the correction factor depends on the implementation of the signal-conditioning unit. A previous section described how the described invention makes it possible to combine soft decisions from different modulation schemes. This approach can be extended to cope with different signal-conditioning units by varying the quality metric values $\Theta_n$ with the selected implementation.

The invention claimed is:

1. A method of producing soft decisions for a signal received at a receiver, wherein a model provides an expression for an LLR for the signal, the LLR expression is dependent on noise power in the signal and can be rendered in a form independent of the noise power, wherein the method comprises evaluating the noise power independent expression using values from the signal to produce soft decisions that are stored in buffers within the receiver, calculating a weight expressing the noise power affecting a soft decision relative to the noise power affecting at least one other soft decision and applying the weight to its respective soft decision.

2. A method according to claim 1, wherein said weight is a function of a quality metric of the soft decision and of the quality metric(s) of at least one other soft decision.

3. A method according to claim 2, wherein the quality metrics are the inverse of the noise power.

4. A method according to claim 1, wherein the soft decisions are treated in groups for the purpose of weight determination.

5. A method according to claim 1, wherein the step of calculating a weight comprises processing the signal, received through a physical channel, through an equaliser whose vector of filter coefficients is derived in a procedure involving the calculation of the quantity $h^H R^{-1} h$ where h is a CIR estimate of the channel and R is the correlation matrix of the signal as supplied to the equaliser and calculating weights for soft decisions derived from the signal as output by the equaliser using said quantity, wherein said weights express relative variation in noise power between soft decisions derived from the signal as output by the equaliser.

6. A method according to claim 1, wherein the expression includes a constant multiplicative factor and the method comprises acquiring parameters from the signal necessary for soft decision calculation and calculating a soft decision from the parameters using a modified form of the expression in which the factor is absent.

7. A method according to claim 1, wherein the signal can use a first modulation scheme and a second modulation scheme, a first model provides a first expression for an LLR for the signal when the first modulation scheme is used, a second model provides a second expression for an LLR for the signal when the second modulation scheme is used, the second expression contains a constant scaling factor absent from the first expression and the method comprises providing a signal using the second modulation scheme and calculating soft decisions for the signal from the second expression in a form that is scaled to counter the factor.

8. A method according to claim 1 further comprising receiving a first transmission of information using a first modulation scheme, receiving a second transmission of said information using a second modulation scheme, generating first soft decisions for the information from the first transmission, generating second soft decisions for the information from the second transmission and combining a first soft decision and a second soft decision to produce an enhanced soft decision for part of the information, wherein the second soft decision is scaled relative to the first soft decision in the combining step.

9. The method according to claim 1, wherein applying the weight comprises applying the weight in a multiplicative manner.

10. Apparatus for producing soft decisions for a signal, wherein a model provides an expression for an LLR for the signal, the LLR expression is dependent on noise power in the signal and can be rendered in a form independent of the noise power, wherein the apparatus comprises means for evaluating the noise power independent expression using values from the signal to produce soft decisions, means for calculating a weight expressing the noise power affecting a soft decision relative to the noise power affecting at least one other soft decision and means for applying the weight to its respective soft decision.

11. Apparatus according to claim 10, wherein said weight is a function of a quality metric of the soft decision and of the quality metric(s) of at least one other soft decision.

12. Apparatus according to claim 11, wherein the quality metrics are the inverse of the noise power.

13. Apparatus according to claim 10, wherein the soft decisions are treated in groups for the purpose of weight determination.

14. Apparatus according to claim 10, wherein the calculating means comprises means for processing a signal, received through a physical channel, through an equaliser whose vector of filter coefficients is derived in a procedure involving the calculation of the quantity $h^H R^{-1} h$ where h is a CIR estimate of the channel and R is the correlation matrix of the signal as supplied to the equaliser and the apparatus further comprises means for calculating weights for soft decisions derived from the signal as output by the equaliser using said quantity, wherein said weights express relative variation in noise power between soft decisions derived from the signal as output by the equaliser.

15. Apparatus according to claim 10, wherein the expression includes a constant multiplicative factor and the apparatus comprises means for acquiring parameters from the signal necessary for soft decision calculation and means for calculating a soft decision from the parameters using a modified form of the expression in which the factor is absent.

16. Apparatus according to claim 10, wherein the signal can use a first modulation scheme and a second modulation scheme, a first model provides a first expression for an LLR for the signal when the first modulation scheme is used, a second model provides a second expression for an LLR for the signal when the second modulation scheme is used, the second expression contains a constant scaling factor absent from the first expression and the apparatus comprises means for calculating soft decisions for a signal using the second modulation scheme from the second expression in a form that is scaled to counter the factor.

17. Apparatus according to claim 10, further comprising means for receiving a first transmission of information using a first modulation scheme, means for receiving a second transmission of said information using a second modulation scheme, means for generating first soft decisions for the information from the first transmission, means for generating second soft decisions for the information from the second transmission and means for combining a first soft decision and a second soft decision to produce an enhanced soft decision for part of the information, wherein the second soft decision is scaled relative to the first soft decision by the combining means.

18. The apparatus according to claim 10, wherein the means for applying the weight causes the weight to be applied in a multiplicative manner.

* * * * *